United States Patent [19]
Lee

[11] Patent Number: 5,821,615
[45] Date of Patent: Oct. 13, 1998

[54] SEMICONDUCTOR CHIP PACKAGE HAVING CLIP-TYPE OUTLEAD AND FABRICATION METHOD OF SAME

[75] Inventor: Byeong-Duck Lee, Seoul, Rep. of Korea

[73] Assignee: LG Semicon Co., Ltd., Cheongju, Rep. of Korea

[21] Appl. No.: 759,210

[22] Filed: Dec. 5, 1996

[30]     Foreign Application Priority Data

Dec. 6, 1995 [KR] Rep. of Korea ................. 1995/47162

[51] Int. Cl.⁶ .................................................. H01L 23/02
[52] U.S. Cl. ........................ 257/686; 257/692; 257/723; 257/796
[58] Field of Search ................... 257/686, 723, 257/796, 696, 692

[56]                    References Cited

U.S. PATENT DOCUMENTS

| 4,079,511 | 3/1978 | Grabbe | 257/723 |
|---|---|---|---|
| 5,554,886 | 9/1996 | Song | 257/686 |

FOREIGN PATENT DOCUMENTS

| 52-19971 | 2/1977 | Japan | 257/692 |
|---|---|---|---|
| 5-183103 | 7/1993 | Japan | 257/686 |

*Primary Examiner*—Sara W. Crane
*Assistant Examiner*—Roy Potter
*Attorney, Agent, or Firm*—Fleshner & Kim

[57]                    ABSTRACT

A semiconductor chip package having a clip type lead frame and fabrication thereof. The package includes a semiconductor chip having a plurality of bond pads thereon, a first package body having a recess, a plurality of inner leads each connected electrically to a corresponding one of the bond pads, a plurality of outleads each extended from a corresponding one of the inner leads for covering along sides of the first package body, and a second package body which covers the semiconductor chip, a plurality of metallic wires and the inner leads. The fabrication method includes the steps of forming a first package body having a recess therein, attaching to the first package body a plurality of inner leads and outleads extended from the inner leads thus to be coveringly exposed on sides of the first package body, attaching in the recess a semiconductor chip having a plurality of bond pads thereon, wire-bonding for electrically connecting each of the inner leads by a metallic wire to a corresponding one of the bond pads provided on the semiconductor chip, and forming a second package body for covering the semiconductor chip, the inner leads and the metallic wires.

13 Claims, 4 Drawing Sheets

SEMICONDUCTOR CHIP PACKAGE HAVING CLIP-TYPE OUTLEAD AND FABRICATION METHOD OF SAME

BACKGROUND OF THE INVENTION

1. Field of the Invention

The present invention relates to a semiconductor chip package, and more particularly to a semiconductor chip package having a clip-type lead frame and fabrication method thereof for enabling a variety of mountings on a printed circuit board.

2. Description of the Prior Art

As shown in FIGS. 1A and 1B showing an inner structure of a semiconductor chip package according to a conventional art, a lead frame 3 provided in semiconductor chip packages 1, 1' includes a die paddle 4 having a semiconductor chip 2 attached thereon, a plurality of inner leads 5 adjacent to the die paddle 4, and a plurality of outleads 6 each extended from a corresponding one of the inner leads 5.

In the packages 1, 1' having such a lead frame structure, the chip 2 attached on the die paddle 4 is electrically connected to the inner leads 5 of the lead frame 3, and the die paddle 2 having the chip 2 thereon and the inner leads 5 are molded by a molding compound 8.

The fabrication of the thusly composed semiconductor chip package is completed by carrying out: a die bonding for attaching the semiconductor chip 2 sliced off from a wafer on the die paddle 4 of the lead frame 3; a wire bonding for electrically connecting a chip pad (not shown) provided on the chip 2 to a corresponding one of the inner leads 5 of the lead frame 3; molding a certain area including the paddle 4 having the chip 2 thereon and the inner leads 5 by the molding compound 8; a trimming process for trimming a support bar (not shown) which connects the lead frame 3 to the paddle 4, a dam bar (not shown) connecting the outleads 6 to each other, and a section bar (not shown), thus to fabricate the packages 1, 1'; and a forming process for bending each of the outleads 6 to a certain extent to form a desired shape, thereby completing the fabrication of the chip packages 1, 1'.

However, the conventional semiconductor package has disadvantages in that a lead frame has to be formed separately depending on each of a variety of chip packages, and in particular when applied to a reverse type, a fabrication process or the shape of a lead frame has to be modified.

Further, the conventional semiconductor chip package has difficulty in stacking a plurality thereof on a PCB, and has led to an decreased electrical property due to a lengthened transfer path of a signal.

BRIEF DESCRIPTION OF THE PRESENT INVENTION

Accordingly, it is a first object of the present invention to provide a semiconductor chip package having a clip-type outlead and a fabrication method thereof which is applicable to a variety of semiconductor chip packages and which does not require modification of the fabrication process or the lead frame structure to mount a reverse type or a horizontal type of outleads.

It is a second object of the present invention to provide a semiconductor chip package having a clip-type outlead and a fabrication method thereof for easily stacking a plurality of semiconductor chip packages on a PCB.

It is a third object of the present invention to provide a semiconductor chip package having a clip-type outlead and a fabrication method thereof for enhancing an electrical property by decreasing an electrical path.

To achieve the above-described objects, a clip type lead frame according to a preferred embodiment of the present invention includes a semiconductor chip having a plurality of bond pads thereon, a first package body having a recess formed in an upper surface thereof for receiving the semiconductor chip, a plurality of inner leads each connected electrically to a corresponding one of the bond pads, a plurality of outleads each extended from a corresponding one of the inner leads for covering along sides of the first package body, and a second package body which covers the semiconductor chip, a plurality of metallic wires and the inner leads.

Further, the fabrication method according to the present invention includes the steps of forming a first package body having a recess therein, attaching to the first package body a plurality of inner leads and outleads extended from the inner leads thus to be coveringly exposed on sides of the first package body, attaching in the recess a semiconductor chip having a plurality of bond pads thereon, wire-bonding for electrically connecting each of the inner leads by a metallic wire to a corresponding one of the bond pads provided on the semiconductor chip, and forming a second package body for covering the semiconductor chip, the inner leads and the metallic wires.

DETAILED DESCRIPTION OF THE PRESENT INVENTION

Figure 1A:
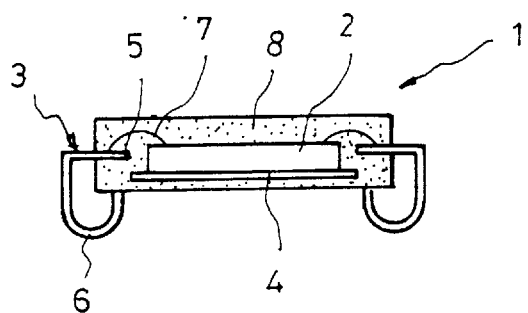
FIGS. 1a and 1b are schematic cross-sectional views each showing an inner structure of a conventional semiconductor chip package.
Figure 1B:
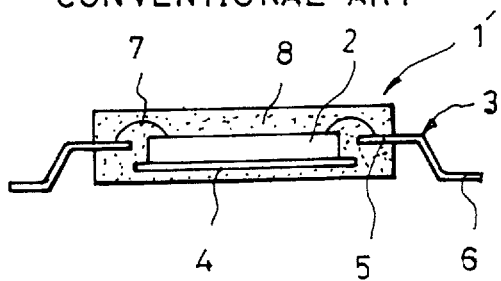
Figure 2:
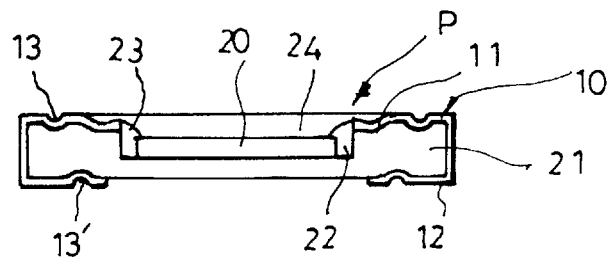
FIG. 2 is a schematic cross-sectional view of a semiconductor chip package having clip type outleads according to the present invention.

As shown in FIG. 2, the semiconductor chip package P according to a first embodiment of the present invention includes: a semiconductor chip 20; a package body 21 having a recess 22 formed in the surface thereof in order to receive the chip 20 therein; a plurality of inner leads 11 each connected electrically to a bond pad (not shown) formed on the chip 20; a clip type lead frame 10 including a plurality of outleads 12 each extended from a corresponding one of the inner leads 11 and being bent to be shaped after a staple thus to be tightly fixed onto the package body 21; and a molding compound 24 for molding a certain portion of the package body 21 including the semiconductor chip 20, a plurality of wires 23 and the inner leads 11.

The lead frame 10 including the inner leads 11 and the outleads 12 tightly and attachedly covers along sides of the package body 21, and each of the outleads 12 has first and second crooked portions 13, 13' each at an upper and a lower portion thereof so that the staple shaped outleads 12 are tightly and fixingly fastened on the package body 21. At this time, the crooked portion can be selectively formed at an upper or a lower portion of the outlead 12 but it is preferred to form at an upper and a lower portion of the outleads 12.

Figure 3:
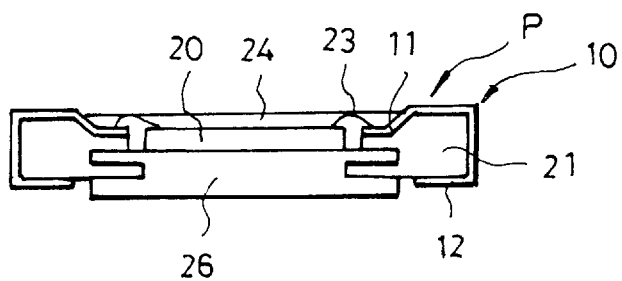
FIG. 3 is a schematic cross-sectional view of a semiconductor chip package including a high thermal performance having clip type outleads according to the present invention.

With reference to FIG. 3 adapting the same reference numerals as used in FIG. 2, a semiconductor chip package according to a second embodiment of the present invention includes: a semiconductor chip 20; a package body 21 on which a semiconductor chip 20 is mounted and in which a part of a heat spread 26 for emitting heat caused by the chip 20 is embedded; a plurality of inner leads 11 each electrically connected by a bond pad (not shown) and a wire 23 to the chip 20; a clip type lead frame 10 including a plurality of outleads 12 each extended from a corresponding one of the inner leads 11 and being bent to be shaped after a staple thus to be tightly fixed onto the package body 20; and a molding compound 24 for molding a certain portion of the package body 21 including the semiconductor chip 20, a plurality of wires 23 and the inner leads 11.

The outleads of the chip package according to the second embodiment of the present invention expose three sides thereof and accordingly can be used as a mounting surface when mounted on a PCB.

The fabrication method of the thusly composed semiconductor package P will now be described.

First, the package body 21 having a recess 22 in the upper surface of the package body 21 is formed, and also the body formation may be carried out after providing a heat spread 26 in the package body 21.

Then, the clip type lead frame 10 is coveringly fixed onto the body 21, and a semiconductor chip 20 is attached in the recess 22 of the body 21. Here, the fabrication process for a lead frame fixing and a chip attachment is not necessarily required to follow the same order.

Thereafter, each of the inner leads 11 of the lead frame 10 and corresponding ones of the bond pads (not shown) provided on the chip 20 are electrically connected by wires 23 to each other.

The process is completed by molding, potting or sealing a certain area of the package body 21 using a molding compound 24.

Figures 4A, 4B:
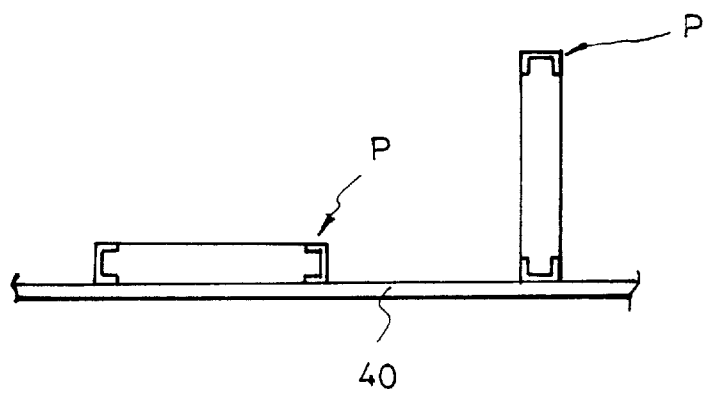
FIG. 4A is a side view showing a semiconductor chip package having clip type outleads according to the present invention, which package is horizontally mounted on a printed circuit board.
FIG. 4B is a side view showing a semiconductor chip package having clip type outleads according to the present invention, which package is vertically mounted on a printed circuit board.

The semiconductor package P according to the present invention may be mounted horizontally as shown in FIG. 4A or vertically as shown in FIG. 4B, on a PCB 40.

Figure 4C:
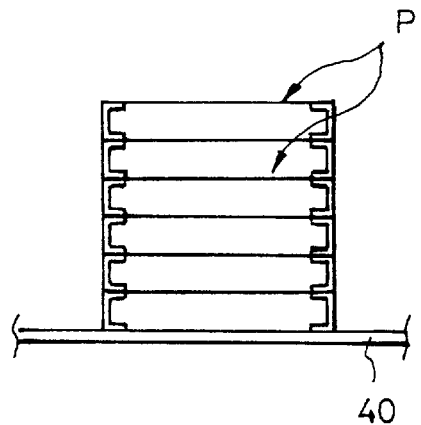
FIG. 4C is a side view showing a stacked set of semiconductor chip packages each having clip type outleads according to the present invention, each of which packages is mounted on a printed circuit board.
Figure 4D:
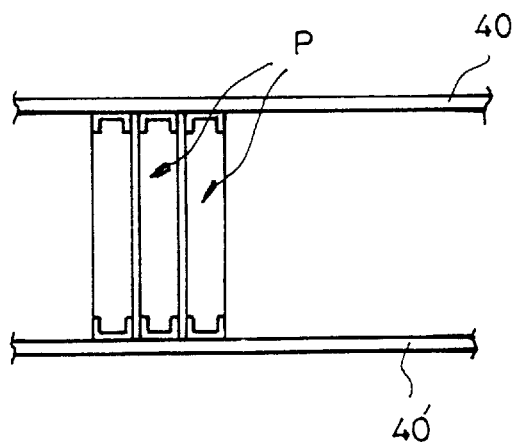
FIG. 4D is a side view showing a set of semiconductor chip packages each having clip type outleads according to the present invention, each of which packages is horizontally stacked between a pair of printed circuit boards.

Also, as shown in FIG. 4C, a plurality of chip packages P may be vertically stacked on the PCB 40, and as shown in FIG. 4D, a plurality of upright semiconductor packages may be horizontally stacked between a pair of PCBs 40, 40' to thereby obtain a dual terminal type package set.

Figure 5A:
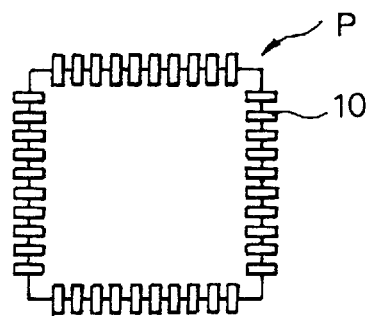
FIG. 5A is a schematic plan view of a quad type semiconductor chip package having clip type outleads according to the present invention.
Figure 5B:
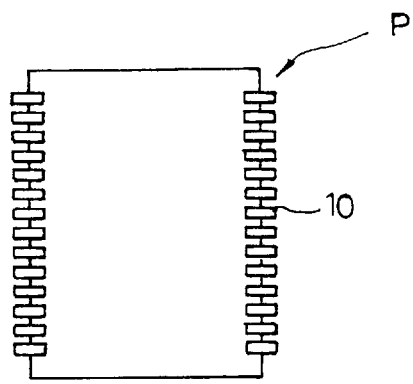
FIG. 5B is a schematic plan view of a dual-line semiconductor chip package having clip type outleads according to the present invention.
Figure 5C:
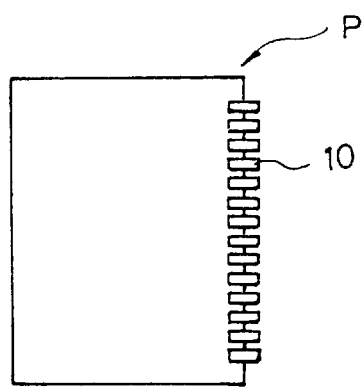
FIG. 5C is a schematic plan view of a single-line semiconductor chip package having clip type outleads according to the present invention.

As shown in FIGS. 5A–5C, depending on a method of providing a clip type lead frame, the semiconductor chip package according to the present invention can be varied to a quad type package shown in FIG. 5A, a dual line type package shown in FIG. 5B and a single line type package shown in FIG. 5C.

Figure 6:
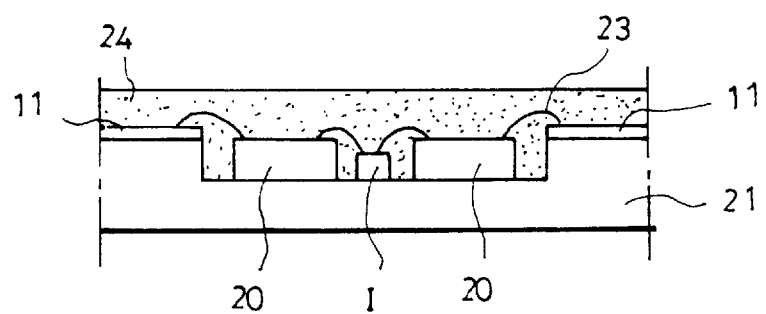
FIG. 6 is a schematic partial view of a multi-chip module package including a plurality of semiconductor chip packages therein according to the present invention.

Referring to FIG. 6, the semiconductor chip package according to the present invention is applicable to a multi-chip module (MCM) package without modifying the package structure. That is, a plurality of chips 20 and a plurality of connection leads I are provided in a recess 22 of the package body 21, a clip type lead frame 10 being insertingly provided in the package body 21, and the inner leads 11 and the chip 20 and the connection leads I are electrically connected by a wire 23 to each other to thereby complete the fabrication.

As described above, the semiconductor chip package having a clip-type outlead thereof according to the present invention simplifies the package fabrication process by using a ready made clip type lead frame.

Further, the present invention improves the rate of a signal flow by decreasing an electrical path, serves to fabricate a variety of chip packages by using a single kind of lead frame, betters a solder fatigue property due to a fact that when a package is mounted on a PCB, irrespective of a narrow interval between the PCB and the chip package the outleads are clipped on the package body instead of being simply attached thereto.

Still further, the chip package according to the present invention can be vertically or horizontally mounted on the PCB and also easily stacked with other packages to thereby facilitate a memory extension.

Furthermore, the semiconductor chip package according to the present invention prevents a thermal mismatch, a delamination and a moisture intrusion.

What is claimed is:

1. A semiconductor chip package, comprising:
   a first package body having a recess formed on a top surface thereof;
   a semiconductor chip attached to the first package body, the semiconductor chip having a plurality of bond pads;
   a plurality of leads, each of the leads having an inner portion that is electrically connected to a bond pad of the semiconductor chip and a U-shaped outer portion that extends from the inner portion, wherein a base of each of the U-shaped outer portions covers a side surface portion of the first package body, and wherein legs of each of the U-shaped outer portions cover top and bottom surface portions, respectively, of the first package body;
   a plurality of conductive media that couples said plurality of bond pads and said plurality of leads; and
   a second package body which covers the semiconductor chip, the plurality of conductive media and the inner portions of the plurality of leads.

2. The semiconductor chip package of claim 1, wherein the outer portions of each of the leads have at least one pocket that extends into the first package body.

3. The semiconductor chip package of claim 1, wherein the outer portions of each of the leads have at least one top pocket that extends into a top surface portion of the first package body and at least one bottom pocket that extends into a bottom surface portion of the first package body.

4. The semiconductor chip package of claim 3, wherein the at least one top pocket and the at least one bottom pocket extend towards one another.

5. The semiconductor chip package of claim 1, further comprising a heat sink, wherein the semiconductor chip is mounted on an upper surface of the heat sink, and wherein a lower surface of the heat sink is exposed.

6. The semiconductor chip package of claim 1, wherein the second package body comprises a resin molded over the semiconductor chip the conductive media and the inner portions of the plurality of leads.

7. The semiconductor chip package of claim 1, wherein said plurality of conductive media comprise a plurality of wires that couple the bond pads of the semiconductor chip and the inner portions of the leads.

8. The semiconductor chip package of claim 7, wherein the second package body comprises a resin molded over the semiconductor chip, the plurality of wires and the inner portions of the plurality of leads.

9. A semiconductor chip package, comprising:

a heat sink having an exposed bottom surface;

a semiconductor chip having bond pads, wherein the semiconductor chip is attached to an upper surface of the heat sink;

a first package body attached to the heat sink;

a plurality of leads that are attached to the first package body, wherein each of the leads includes an inner portion that is electrically connected to a bond pad of the semiconductor chip and an outer portion that extends from the inner portion, and wherein the outer portions of each of the leads cover top, side and bottom surface portions of the first package body;

a plurality of conductive media coupling said plurality of bond pads and leads; and a second package body which covers the semiconductor chip and the inner portions of the leads.

10. The semiconductor chip package of claim 9, wherein top parts of the outer portions of the leads extend above top surfaces of the first and second package bodies, and wherein bottom parts of the outer portions of the leads extend below bottom surfaces of the first and second package bodies.

11. The semiconductor chip package of claim 9, wherein the outer portions of each of the leads have at least one pocket that extends into the first package body.

12. The semiconductor chip package of claim 9, wherein the outer portions of each of the leads have at least one top pocket that extends into a top surface portion of the first package body and at least one bottom pocket that extends into a bottom surface portion of the first package body.

13. The semiconductor chip package of claim 12, wherein the at least one top pocket and the at least one bottom pocket extend towards one another.

* * * * *